United States Patent [19]
Vane

[11] Patent Number: 6,105,589
[45] Date of Patent: Aug. 22, 2000

[54] OXIDATIVE CLEANING METHOD AND APPARATUS FOR ELECTRON MICROSCOPES USING AN AIR PLASMA AS AN OXYGEN RADICAL SOURCE

[76] Inventor: Ronald A. Vane, 3124 Wessex Way, Redwood City, Calif. 94061

[21] Appl. No.: 09/228,318

[22] Filed: Jan. 11, 1999

[51] Int. Cl.[7] .................................................. B08B 7/00
[52] U.S. Cl. ........................... 134/1.1; 134/1.2; 134/18; 204/192.34; 204/298.36
[58] Field of Search ................................ 134/1.1, 1.2, 18; 204/192.34, 298.36

[56] References Cited

U.S. PATENT DOCUMENTS

| | | |
|---|---|---|
| 4,665,315 | 5/1987 | Bacchhetti et al. . |
| 5,312,519 | 5/1994 | Sakai et al. . |
| 5,401,974 | 3/1995 | Oae et al. . |
| 5,466,942 | 11/1995 | Sakai et al. . |
| 5,510,624 | 4/1996 | Zaluzec . |
| 5,539,211 | 7/1996 | Ohtoshi et al. . |
| 5,633,502 | 5/1997 | Fishone . |

OTHER PUBLICATIONS

Book: *Glow Discharge Processes*, Brian Chapman, John Wiley & Sons New York 1980.
Book: *Principles of Plasma Discharges and Materials Processing*, Michael A. Lieberman and Allen J. Lichtenberg, John Wiley & Sons, New York, 1994.
Product Literature: *Low Pressure Nitrogen Purge Stops Oil Contamination in SEMs*, Ronald Vane, XEI Scientific, Redwood City, CA 1993, 1997.
*Oxidative Cleaning in SEMs*, Ronald Vane, XEI Scientific, Redwood City, CA 1999.
Recovery of SEM Image by In–Situ Cleaning of contaminated Objective Aperture, Kenji Ohtoshi. M. Ogasawara, K Sugihara, Y, Yamazaki and M. Miyoshi, Jpn. J. Appl. Phys. vol. 35 (1996) pp 4128–4132 part 1, No. 7, 1996 Japan.
Use of Chemically–Reactive Gas Plasmas in Preparing Specimens for Scanning Electron Microscopy and Electron Probe Microanalysis R.S. Thomas and J.R. Hollahan.
Scanning Electron Micrsocopy/1974, pp. 83–89 (part 1) Proceedings of the Scanning Electron Microscope Symposium, IIT Research Institute, Chicago, IL 60616.

*Primary Examiner*—Zeinab El-Arini

[57] ABSTRACT

An improved method and apparatus are provided for cleaning the specimen and interior specimen chamber of Electron Microscopes, and similar electron beam instruments. The apparatus consists of a glow-discharge, oxygen-radical generator placed on a specimen chamber port with an excitation source to create a low-power glow-discharge plasma inside the generator. Air or other oxygen and nitrogen mixture is admitted to the generator at a pressure between 0.3 Torr and 5 Torr. The low power glow discharge is used to disassociate oxygen preferentially over nitrogen to create the oxygen radicals. The oxygen radicals then disperse by convection throughout the chamber to clean hydrocarbons from the surfaces of the chamber, stage and specimen by oxidation to CO and $H_2O$ gases. The excitation power of the plasma is limited to limit the nitrogen ion production that destroys the oxygen radicals and to limit the projection of the electrically active plasma into the specimen chamber. The optical emission or color of the plasma is observed for the selection of the correct power level for maximum oxygen radical production.

14 Claims, 2 Drawing Sheets

SCANNING ELECTRON MICROSCOPE
WITH CLEANING DEVICE

SCANNING ELECTRON MICROSCOPE
WITH CLEANING DEVICE

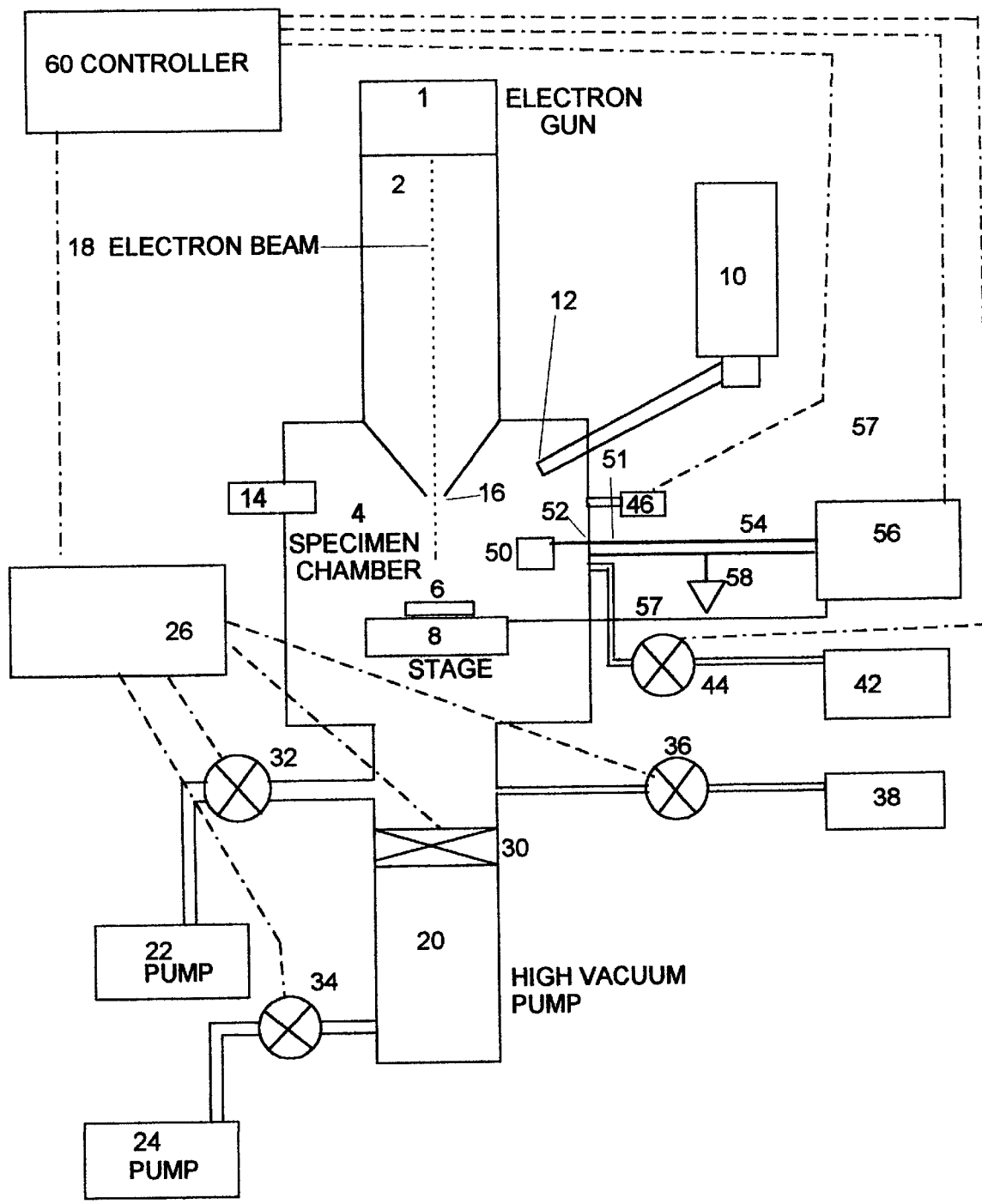
FIG. 2 SEM CLEANING CONTROL

OXIDATIVE CLEANING METHOD AND APPARATUS FOR ELECTRON MICROSCOPES USING AN AIR PLASMA AS AN OXYGEN RADICAL SOURCE

RELATED PATENT APPLICATIONS

Ser. No. 09/054,749 "Simultaneous Specimen Chamber, Specimen, and Stage Cleaning Device and Method for Electron Microscopes" filled Mar. 4, 1998 now abandoned. Patent application Ser. No. 09/499909 filed Feb. 8, 2000 "Compact RF Device for Cleaning Electron Microscopes and Vacuum Chambers" that reveals new art in the same field of invention.

BACKGROUND OF THE INVENTION

1. Field of Invention

The present invention relates to cleaning analytical instruments such as Scanning Electron Microscopes (SEM), Scanning Electron Microprobes, Transmission Electron Microscopes (TEM) and other charge particle beam instruments that are subject to contamination problems from hydrocarbons. In particular it is a novel method and apparatus for cleaning the specimen chamber, specimen stage, and specimen in-situ inside the vacuum system of these instruments with oxygen radicals that uses air passed through a glow discharge as an oxygen radical source. The oxygen radicals are used to oxidize the hydrocarbons and convert them to easily pumped gases. The method and apparatus can be added to the analytical instrument with no change to its analytical purpose or design.

2. Description of Prior Art

Electron microscopy is used to detect, measure, and analyze constituents present in very small areas of materials. Contaminants adsorbed on the surface or surface films interacting with the incident electron probe beam can distort the results. Deposits created by the interaction of the probe beam with the surface specimen also may interfere with the probe bean or emitted electrons and x-rays and thus adversely affect accurate analysis. Deposits also add uncertainty to SEM measured line widths for semiconductor device critical dimension metrology.

Another problem is the condensation of pump oils on the windows of the x-ray and electron detectors distorting results. The most serious problem of this type is the absorption of low-energy x-rays from Be, C, N, O and F by oil films which can prevent measurement of these elements by X-ray emission spectroscopy.

Contaminants typically are introduced by one of four ways including the specimen, the specimen stage, carried into the chamber by the evacuation system, or are present on the internal components of the instrument. Contaminants introduced from the evacuation system can be reduced by trapping, by purging, or by using cleaner pumps. Once present inside the chamber these contaminants reside on the chamber surfaces, and can be removed only slowly and with low efficiency by the high vacuum pump.

Inorganic specimens (metals, ceramics, semiconductors, etc.) may carry contaminants into the chamber. These may be part of the specimen, residues from sample preparation techniques or be caused improper sample handling or storage techniques. In addition, clean surfaces will accumulate a surface film of hydrocarbon scum if left exposed to ordinary room air for any length of time. The sources of these hydrocarbons are most any living thing, organic object, or other source of hydrocarbon vapors in the vicinity.

While the part of the films created in these processes dissipate under vacuum conditions, a small amount generally remains on surfaces and is sufficient to cause problems when the specimen is subsequently examined in the analytical instruments listed.

These residues are widely distributed and generally are at low concentrations on the various surfaces. Some of the contaminant molecules become mobile in the vacuum environment. At high vacuum the mean free path of molecules once vaporized is comparable to or longer than the dimensions of the vacuum chamber of these instruments. The contaminants move in the vapor phase from surface to surface in the vacuum environment and are attracted to any focused electron probe beam, forming deposits through an ionization and deposition process. Since these contaminants can travel large distances within the vacuum chamber and over the surface of a specimen, it is important to remove or immobilize these species as much as possible prior to an analysis without disturbing the microstructure of the specimen.

Ronald Vane, Dba XEI Scientific, has sold a nitrogen purge system for cleaning SEM chambers since 1991. Operating at a pressure of approximately 1 Torr in the chamber, this system uses viscous flow vacuum dynamics to carry contaminants from the chamber to the roughing pumps. This system is operated every night and needs at least 40 hours a week of operation to keep the chamber clean. It is not fast, it does not reactively clean, and cannot be used where 24 hr instrument availability is needed for the electron microscope. Another problem for the purge technique is the changing design of electron microscope vacuum systems. The latest design pumping systems use turbo molecular pump without a valve between the chamber and the pump. To vent the chamber the turbo pump is stopped and gas admitted to the chamber. During the pump down cycle, roughing takes place through the turbo molecular pump while it is accelerating. Any leak of gas into the chamber into the chamber during rough will result in an overheated turbo pump. Thus a continuous purge is not possible for this type of vacuum system.

It has been well documented that low temperature (<500° C.) plasmas of various ionized gases can be used to reactively etch/ash organic materials found on the surface of materials. As "glow-discharge cleaning" it has been used by the high energy physics community to condition the interiors of large vacuum vessels. Named "plasma etch" or "plasma ashing", it has been used in the industrial community to clean and etch semiconductor wafers and other bulk materials for many years. In the microscopy community RF or DC plasma, dry-ashing devices are sold by several vendors to clean electron microscope specimens prior to analysis. In this procedure, typically the material is placed in an RF cavity or a DC cavity with a flowing reactive gas. The nature of the gas selected is chosen based upon the desired effect. Argon, nitrogen, air, oxygen or other gas mixtures are commonly used, and gases ($BCl_3$, $CF_4$) may be used to tailor the reaction.

Most of the current literature and recent patents on glow-discharge cleaning and plasma etch is concerned with the use of these processes in semiconductor production. For these processes plasma uniformity, anisotropic etching, and other highly controlled properties are important. The geometry of these systems is very carefully designed for uniform results. A variety of gases can be used for etching and cleaning. Gases such as Hydrogen, Argon, Nitrogen, Oxygen, $CF_4$ and gas mixtures such as air and argon/oxygen have successfully been used for glow-discharge cleaning and plasma etching. Depending on the process the importance of ion sputtering and reactive ion etching varies, but in most of processes the neutral free radicals are the most important reactive species in the plasma. The free radicals, because they are neutral, are able to leave the electric fields of the excitation region and travel throughout the chamber by convection.

For the cleaning and removal of hydrocarbons the reaction with oxygen radicals to produce CO, $CO_2$ and $H_2O$ is the most important. These reaction products are quickly removed as gases from the vacuum system. These reactions are the dominant reactions in glow discharge cleaning methods using oxygen as a reactant gas. The glow discharge is used to produce oxygen ions that are then transformed into oxygen radicals by subsequent reactions. The oxygen ions are not needed as the reactive species for hydrocarbons. In the absence of nitrogen ions or other reactive species that destroy O radicals, O radicals are long lived and have the ability to do isotropic cleaning on all surfaces in the chamber. $CF_4$ or other fluorine containing gases are sometimes added to oxygen containing plasmas to speed the oxidation of hydrocarbons by performing hydrid extraction on the base molecules to make them more susceptible to oxygen attack. This mechanism is important in the oxidation and removal of polymers such as photoresist.

Electron Beam Lithography systems scan an electron beam over organic resist materials which spew contaminants throughout the vacuum system and electron optics. The deposition of contaminants on the optics elements such as apertures, deflectors and lenses degrades performance and precision drawing ability of these instruments. Glow-discharge and plasma cleaning devices and cleaning methods for electron optics are described in U.S. Pat. Nos. 5,312,519 (Sakai et al.), 5,539,211 (Ohtoshi et al.) and 4,665,315 (Bacchetti et al.). These patents do not address the solving of the contamination problem on specimens within analytical electron microscopes.

The Sakai et al patent describes a method where electrically neutral active species are formed outside of the chamber in a plasma discharging gas and passed through a selection device which stops the ions and electrons from entering the chamber. The plasma described is generated in a microwave cavity and then carried to the chamber in a tube. This method destroys some of the active neutral species by wall collisions on the way to the chamber whereby its effectiveness is reduced. The preferred embodiment of the Sakai et al method also uses a oxygen and CF4 gas mixture as the reactive gas. This mixture or pure oxygen can cause explosive conditions in vacuum pumps using conventional hydrocarbon pump oil. Electron microscopes commonly use this oil and its replacement involves an expensive rebuild and cleaning of the pumps to accept non-reactive fluorocarbon oil. For oxygen to be used as a cleaning gas in electron microscope it must be diluted with a inert gas such the noble gases or nitrogen to avoid this explosion hazard.

A device for cleaning electron microscope stages and specimens is described in U.S. Pat. No. 5,510,624 (Zaluzec) for analytical electron microscopes. That apparatus uses an plasma generating chamber and an airlock to allow the specimen and stages to be placed into the plasma chamber for cleaning. It may be connected with the analytical chamber of the analytical electron microscope. A refinement of this device is described in U.S. Pat. No. 5,633,503 (Fichone). This device cleans by the use of sputter etching and fragmentation when argon is used as the reactive gas. When oxygen is used reactive ion etching adds to the cleaning effect. Sputter etching and reactive ion etching are anisotropic processes. This has two effects, cleaning is not evenly distributed but is concentrated to where there is ion bombardment of surfaces, and the ion bombardment may cause unwanted of sputter deposition and etching within the analytical chamber resulting in damage to the instrument and specimen.

The previous related invention of R. Vane (U.S. patent application Ser. No. 09/054,749) for glow discharge cleaning within the specimen chamber of the electron microscope using a plasma generator in-situ within the specimen chamber was found to have several disadvantages in practice as follows:

a) The use of argon and other noble gases is not good for the ion pumps used on the electron columns of many electron microscopes. Noble gases are not pumped well by dipole ion pumps.

b) Generating a free plasma inside the specimen chamber may subject the walls and surfaces within the chamber to electron and ion bombardment which may cause damage.

c) Some ion species in some gas-plasmas will polymerize the surface hydrocarbons to inhibit further oxidation and cleaning.

It is an object of the present invention to provide an improved method for cleaning the specimen chamber, specimen stage and a specimen in the vacuum system of an electron microscope or similar analytical instrument using an electron beam such as a scanning electron microprobe instrument. It is another object of the present invention to provide an improved cleaning method and apparatus that uses air passed through a low powered glow-discharge or gas-plasma as source of oxygen radicals to oxidize the hydrocarbon contaminants in the specimen chamber and convert them to easily pumped gases. It is another object of the present invention to minimize contact and ion bombardment of the specimen and specimen stage by the electrically active gas plasma containing ions and electrons that may cause damage. It is another object of the present invention to provide a cleaning system that is small and that can be mounted on a standard chamber port of the electron microscope without mechanical interference from other devices and parts of the electron microscope. This improvement results in a cleaning system that is faster and cleans the specimen chamber, stage, and specimen of the analytical instrument better than previous arrangements. The result of a cleaner specimen, specimen chamber and stage is that the deposition of hydrocarbon polymer on the scanned area is reduced or eliminated resulting in better measurements. Another result of cleaner specimen chambers is that the condensation and adsorption of hydrocarbons on detector windows is reduced which allows the passage of more low energy x-rays and electrons through these windows.

SUMMARY OF THE INVENTION

An improved method and apparatus for oxidative cleaning the specimen chamber, the specimen, and the specimen stage of electron microscopes and other charged beam instruments are disclosed. The invention covers the use of oxygen radical generator that uses air and a glow discharge that is mounted on a port of the specimen chamber of the electron microscope whereby the oxygen radicals enter the chamber by convection and remove hydrocarbons by oxidation. The invention also covers the operation and design of the oxygen radical generator in such a way that allows it to generate oxygen radicals from air and other nitrogen/oxygen mixtures without the production of large numbers of nitrogen and NO⁺ ions. This generator contains a gas plasma and apparatus for RF or DC excitation of a gas-plasma or "glow-discharge" to create oxygen radicals for cleaning the interior walls and surfaces, specimen stage and specimen. The invention also covers a control method and arrangement for operating the evacuation system of the electron microscope, the RF plasma or DC plasma, and the admission of gas into the chamber. The invention also covers the use of the change of optical emission or color of the plasma to select the proper power or voltage for exciting the plasma to maximize oxygen radical production.

BRIEF DESCRIPTION OF THE DRAWINGS

The present invention together with the above and other objects and advantages may best be understood from the following detailed description of the preferred embodiments of the invention illustrated in the drawing, wherein:

FIG. 2 is a diagram of a control system for the present invention and its interaction with the SEM evacuation control system.

Figure 1:
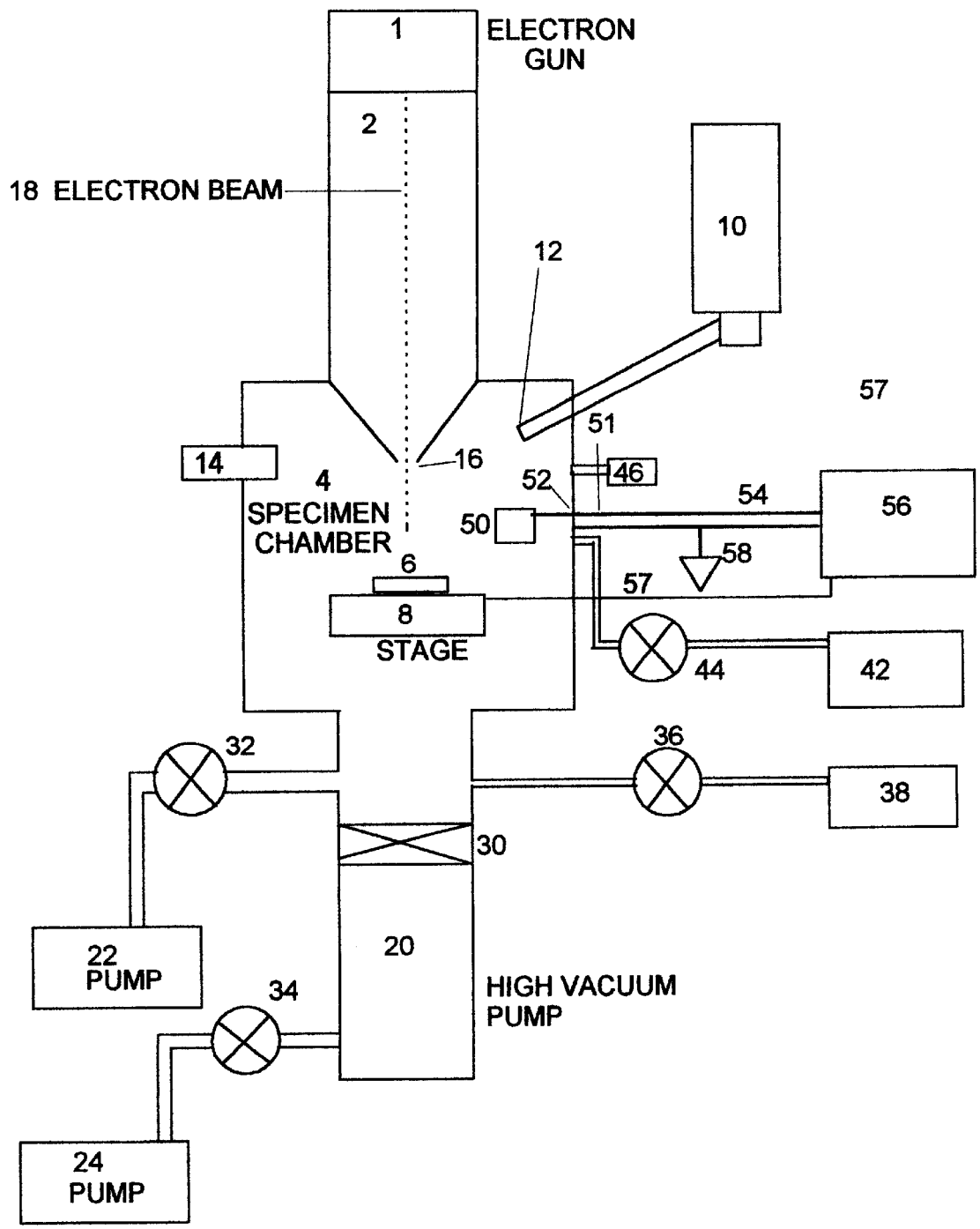
FIG. 1 is a diagram of a typical scanning electron microscope (SEM) and accessories with an apparatus to implement the present invention installed.

| Referenee Numerals in Drawings | |
| --- | --- |
| 1 | Electron Gun |
| 2 | Electron Column |
| 4 | Specimen Chamber |
| 6 | Specimen |
| 8 | Specimen Stage |
| 10 | X-ray Spectrometer |
| 12 | X-ray Detector and Window |
| 14 | Secondary Electron Detector |
| 16 | Final Aperture |
| 18 | Electron Beam |
| 20 | High Vacuum Pump |
| 22 | Roughing Pump |
| 24 | Foreline Pump |
| 26 | SEM Vacuum-Sequence Controller |
| 30 | High Vacuum Valve |
| 32 | Roughing Valve |
| 34 | Foreline Valve |
| 36 | Vent Valve |
| 38 | Vent Gas supply |
| 42 | Glow-Discharge Gas Supply |
| 44 | Glow-Discharge Gas Control Valve |
| 46 | Vacuum Gauge |
| 50 | Plasma Chamber |
| 51 | Glow Discharge Electrode |
| 52 | Insulated-Vacuum Feedthrough |
| 53 | Exit Screen |
| 54 | Power cable |
| 56 | RF or DC Generator |
| 58 | Glow-discharge Generator Ground |
| 60 | Controller - Glow-discharge Cleaning cylindrical screen Apertures Joint |

DETAILED DESCRIPTION OF THE INVENTION

In accordance with the invention, a technique has been developed which allows simultaneous cleaning of the interior, a specimen, and a specimen stage of a scanning electron microscope which minimizes and in some cases eliminates contamination and films from the surface of inorganic specimens during analysis by Scanning Electron Microscopes. The invention also has utility for other analytical instruments such as Transmission Electron Microscopes, Scanning Electron Microprobes and other charged particle beam instruments that have a vacuum environment and provide analytical information from emitted electrons and x-rays from the specimen. The specimen need not be present during chamber and stage cleaning. The procedure, which involves subjecting the specimen chamber, specimen, and stage to oxygen radicals for oxidation and removal of hydrocarbons, is carried out prior to analysis. The oxygen radicals are generated by a glow discharge in low-pressure air or other nitrogen and oxygen mixture. The glow-discharge is generated inside an apparatus mounted on a chamber port on the specimen chamber of the electron microscope or similar electron beam instrument. The apparatus is subject to the same vacuum as the chamber and is either within the chamber or in an extension of the chamber.

The method of the present invention is supported by the invention of an apparatus to produce a low powered glow discharge in air at stated vacuum conditions that generates oxygen radicals when operated at low RF power or DC voltages in the 250 V to 450 V range.

The present invention controls the temperature of the plasma as an important part of the method for generation the oxygen radicals from air or other oxygen and nitrogen gas mixtures. When oxygen is ionized a series of reactions leads to the formation of oxygen radicals:

$$O_2 + O^+ \rightarrow O_2^+ + O$$

$$O_2^+ + e^- \rightarrow O + O$$

Compared to the ions these radicals are long-lived species and may leave the plasma region if they don't react with other ion species or the walls.

The ionization potential of oxygen is 12.1 eV and nitrogen is 15.6 eV. Thus oxygen ionization takes place in a lower temperature or lower energy plasma than nitrogen. By lowering the average temperature of the electron energy distribution oxygen ionization is favored. When nitrogen ions are produced in an air plasma they react with O radicals by the following fast reactions:

$$N_2^+ + O \rightarrow NO^+ + N$$

$$N + O \rightarrow NO^+ + e^-$$

Thus two oxygen radicals are destroyed by every $N_2^+$ ion produced. Because nitrogen is the major constituent of air, this destruction takes place quickly once large scale nitrogen ionization begins. In addition NO⁺ is a stable ion with a low ionization potential (9.5 eV). It is unable to react with the neutral diatomic gases in air. It has weak ability to perform hydride extraction on the surface hydrocarbons to degrade them, but is more likely to form a nitrogen oxide hydrocarbon polymer that is resistant to further oxidation and removal. The transition from an oxygen dominated plasma to nitrogen dominated plasma is easily seem by optical emission. With some glow discharge electrode configurations the plasma suddenly changes color as power is raised by as little as 1 watt. The exact wattage or voltage of this transition depends on the glow discharge means electrode configuration but for a typical RF (13.56 MHz) excited glow discharge the transition was found to lie between 10 and 30 Watts of input power. This transition is also a function of pressure. Higher pressures shorten the mean free path for electrons and they less able to pick up energy from the electric field between collision with molecules. But higher pressures also have the effect of shortening the life times of the oxygen radicals due to increased collision frequency. Thus in the present invention an operating pressure is chosen such that net oxygen radical flux to the surfaces is maximized. The plasma power is adjusted in the present invention to a point below this transition at a selected pressure to obtain oxidative cleaning action. This power level may be found just once for each gas-plasma oxygen-radical generator configuration, and then this level is used for all subsequent operation of the device.

The method in the present invention keeps the plasma temperature low by minimizing the RF power or DC voltage generating the glow discharge, resulting in minimized nitrogen ionization and maximized oxygen radical production from air. The method also uses the changes is optical emission or color of the plasma as an aid to select the proper power or excitation voltage for the plasma excitation that achieves this state.

DETAILED DESCRIPTION OF THE DRAWINGS

FIG. 1 is a schematic of a typical Scanning Electron Microscope (SEM) with a plasma-cleaning device installed. Electron gun 1 generates electron beam 18, which is focused and scanned within electron column 2. The beam 18 exits through aperture 16 into specimen chamber 4 and scans across specimen 6. The specimen 6 is mounted on stage 8. The stage 8 usually can be manipulated to mechanically locate the specimen under the beam 18. The specimen 6 emits electrons and x-rays when scanned and a variety of detectors may be used to obtain analytical information. The most important of these are secondary electron detector 14 and Energy Dispersive (EDS) x-ray detector with a x-ray spectrometer 10. The x-ray detector is separated from the specimen chamber 4 by a x-ray window 12.

Electron scanning for microscopy is done under vacuum conditions. Typically the specimen chamber 4 is connected to high vacuum pump 20 thorough valve 30. Foreline pump 24 is used to pump the exhaust of the high vacuum pump 20. Valve 34 separates the high vacuum pump and foreline pump. Pre-evacuation or roughing the chamber 4 is done by means of roughing pump 22 that connects to the chamber by way of roughing valve 32. In evacuation the chamber 4 a rough vacuum must be obtained first before the high vacuum pump 20 can function. In some arrangements of SEMs, the functions of foreline pump 24 and the roughing pump 22 are combined through means of a valving systems so that only one low vacuum pump is needed for both functions. Venting of the chamber 4 takes place through vent valve 36 using vent gas supply 38 or air. All modem SEM models provide automatic valve sequencing controller 26 to simplify evacuation of the microscope for the user. For most models the user interface consists of a VENT and EVAC or similar push-button control.

The preferred embodiment of the present invention method uses a plasma chamber 50 with an interior glow discharge electrode 51. The plasma chamber 50 connected to a RF or DC generator 56 through cable 54 and insulated vacuum feedthrough 52 connected to the electrode 51. The output of generator 56 is controlled to limit the power and the temperature of the glow-discharge plasma that is excited between the grounded plasma chamber 50 wall and electrode 51. A conductive screen 53 may be placed at the gas exit to the plasma chamber to confine the electric fields and define and fix the impedance between the glow electrode 51 and the plasma chamber 50 walls. Screen 53 is not a trap for the charged species of the plasma. At the preferred operating power and pressures of the present method, the projection of the plasma into the full specimen chamber 4 is self-limited by the quick recombination of the ions and electrons outside of the plasma chamber 50.

The method of the present invention limits the power or voltage supplied to the plasma so that it is dominated by the production of oxygen ions and radicals rather than nitrogen ions and other active nitrogen species. An additional embodiment of the present invention uses the change of color or optical emission of the glow discharge as a method for selecting the proper power or voltage upper limit for plasma generation dominated by oxygen ions and radicals.

In the preferred embodiment of the present invention, the exterior of the chamber 4 and the generator 56 are connected to ground through cable 58. Cable 58 may be the ground shield of a coaxial cable with cable 54 at the center. For a embodiment containing a RF generator a RF matching network may be included in the circuit. Glow-discharge gas supply 42 supplies the reactive gas for the glow-discharge. In the preferred embodiment of the present invention this reactive gas is air. The gas may be any mixture of oxygen and nitrogen. Valve set 44 controls the reactive gas flow into the glow discharge and onto chamber 4. By the method of the present invention the reactive gas is fed directly into the plasma, and oxygen radicals from the plasma are carried into the chamber by convection. Pressure gauge 46 is used to monitor the chamber vacuum during cleaning and may mounted on the plasma chamber 50. The preferred embodiment of the present invention uses a chamber pressure of between 5 Torr and 0.3 Torr. At these pressures sputter etching of the plasma chamber 50 or the electrode 51 is minimized by short mean-free-paths. The present invention uses the oxygen radicals to oxidize the hydrocarbon contaminants to clean the specimen chamber walls, specimen, and specimen stage.

FIG. 2 illustrates the control arrangement for the present invention. Controller 60 is connected to the SEM vacuum sequence controller 26 to start the vent and evacuation cycles. The Controller 60 operates valve 44 to admit air, monitors the vacuum though gauge 46, and operates the RF or DC generator 56 in a predetermined and timed sequence.

OPERATION

The preferred embodiment of the method employs the following operating sequence to clean the chamber:
1. Partially vent the chamber 4 using vent gas 38.
2. When the pressure is above five Torr, restart evacuation.
3. Open valve 44 and admit reactive gas 42 into chamber 4. The reactive gas is air or other mixture of nitrogen and oxygen.
4. The glow discharge may be operated when the pressure is between 0.3 Torr and 5 Torr.
5. At a selected pressure turn on the glow-discharge
6. Operate the glow discharge means at low power to avoid nitrogen ion production.
7. At a predetermined time close valve 44 and let chamber 4 evacuate.
8. At a predetermined time stop oxygen radical cleaning by turning off the glow-discharge.
9. As an option a purge gas of dry nitrogen may be admitted though either valve 44 or 36 to sweep away the remaining oxygen and oxidation product gases after the glow discharge is turned off.
10. Pump SEM down to operating pressure.

The sequence may be repeated, if further cleaning is needed.

The preferred embodiment of the present invention obtains the best (uniform and fast without etching and damage) cleaning action by using a low-temperature plasma in a separate glow-discharge region to generate oxygen radicals which are carried into the whole chamber by convection. Nitrogen/oxygen gas mixtures that contain 19%–30% oxygen are good choices for preferential removal of hydrocarbon films. A high percentage (>50%) oxygen mixture is avoided because of the explosion hazard in the oil sealed vacuum pumps 22 and 24. The cleaning action of present method takes place due to the reactive-neutral oxygen radical species that bombard the surfaces in the chamber. These react with the hydrocarbon molecules to break them up and oxidize them for removal as gases. By creating the plasma in a separate region at low power, high energy ion bombardment of the surfaces in the specimen chamber 4 is avoided to prevent damage and etching of the base materials.

While a present preferred embodiment of the invention is described, it is to be distinctly understood that the invention is not limited thereto but may be otherwise embodied and practiced within the scope of the following claims.

I claim:

1. A method for simultaneous cleaning of specimen chamber, specimen and stage for Scanning Electron Microscope, Transmission Electron Microscope, Scanning Electron Microprobe or other charged particle beam instruments to remove hydrocarbon contaminants by oxidation by generating oxygen radicals from air or other nitrogen/oxygen gas mixtures under vacuum conditions produced within said specimen chamber of said instruments, said method comprising the steps of:

a) providing means for producing said oxygen radicals by a glow-discharge plasma;
   b) providing means for temperature or power control of said glow-discharge plasma; and
   c) using said temperature and power control to minimize ionization of nitrogen and maximize oxygen radical production in said plasma.

2. A method for simultaneous cleaning of specimen chamber, specimen, and stage as described in claim 1, further including the step of providing a plasma chamber connected to or inside said specimen chamber of said instruments to contain said glow discharge plasma.

3. A method for simultaneous cleaning of specimen chamber, specimen, and stage as described in claim 1, further including the step of providing a means of introducing air or other nitrogen/oxygen gas mixtures directly into said glow discharge plasma.

4. A method for simultaneous cleaning of specimen chamber, specimen, and stage as described in claim 1, further including the step of providing a vacuum gauge means and a gas regulating system means to regulate introduction of a gas into said instruments' specimen chamber.

5. A method for simultaneous cleaning of specimen chamber, specimen, and stage as described in claim 1, further including the step of controlling pressure within said specimen chamber to between 5 Torr and 0.3 Torr whereby said oxidation of hydrocarbons within said specimen chamber by said oxygen radicals is maximized.

6. A method for simultaneous cleaning of specimen chamber, specimen, and stage as described in claim 5 further including the step of employing a controller apparatus means to monitor chamber vacuum and to control venting and evacuation of said chamber, said gas mixture, said pressure, and glow-discharge power according to a planned sequence.

7. A method for simultaneous cleaning of specimen chamber, specimen, and stage as described in claim 1, further including the step of using means of venting and evacuation of said chamber provided by said instruments to partially backfill said specimen chamber with gas and then to re-evacuate said chamber.

8. A method for simultaneous cleaning of specimen chamber, specimen, and stage as described in claim 1 further including the step of using a means of observing optical emission or color from said plasma whereby said vacuum conditions and plasma temperature may be adjusted for maximum production of said oxygen radicals.

9. Apparatus for simultaneous cleaning of specimen chamber, specimen and stage for Scanning Electron Microscope, Analytical Electron Microscope, Scanning Electron Microprobe or other charged particle beam instruments to remove hydrocarbon contaminants by oxidation by generating oxygen radicals from air or other nitrogen/oxygen gas mixtures under vacuum conditions within said specimen chamber of said instruments, said apparatus comprising:

a means for producing oxygen radicals by a glow-discharge plasma; and
   a means for temperature or power control of said glow-discharge plasma whereby within said plasma ionization of nitrogen can be minimized and the production of said oxygen radicals can be maximized.

10. Apparatus for simultaneous cleaning of specimen chamber, specimen, and stage as described in claim 9 with a plasma chamber connected to or inside the specimen chamber of said instruments to contain said glow discharge plasma.

11. Apparatus for simultaneous cleaning of specimen chamber, specimen, and stage as described in claim 10 further including a means of introducing air or other nitrogen/oxygen gas mixtures directly into said glow discharge plasma.

12. Apparatus for simultaneous cleaning of specimen chamber, specimen, and stage as described in claim 9 further including a vacuum gauge means and a gas regulating system means to regulate introduction of said gas mixtures into said glow discharge plasma.

13. Apparatus for simultaneous cleaning of specimen chamber, specimen, and stage as described in claim 12 further including a controller apparatus means that monitors said chamber vacuum and controls at least one of venting, evacuation, gas flow, gas mixture, pressure, and glow-discharge power according to a planned sequence.

14. Apparatus for simultaneous cleaning of specimen chamber, specimen, and stage as described in claim 13 wherein said apparatus is connected to means of venting and evacuation said specimen chamber of said instruments to partially backfill said specimen chamber with a gas and then to re-evacuate said chamber.

* * * * *